United States Patent
Xiong et al.

(10) Patent No.: US 12,501,567 B2
(45) Date of Patent: Dec. 16, 2025

(54) SUPPORT PLATE, DISPLAY SCREEN, AND ELECTRONIC DEVICE

(71) Applicant: Honor Device Co., Ltd., Shenzhen (CN)

(72) Inventors: Yuan Xiong, Shenzhen (CN); Zhize Wang, Shenzhen (CN); Yujun Zhang, Shenzhen (CN); Ning Guo, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 236 days.

(21) Appl. No.: 18/272,476

(22) PCT Filed: May 11, 2022

(86) PCT No.: PCT/CN2022/092311
§ 371 (c)(1),
(2) Date: Jul. 14, 2023

(87) PCT Pub. No.: WO2023/005342
PCT Pub. Date: Feb. 2, 2023

(65) Prior Publication Data
US 2024/0090150 A1    Mar. 14, 2024

(30) Foreign Application Priority Data
Jul. 26, 2021  (CN) .......................... 202110846487.5

(51) Int. Cl.
*H05K 5/02* (2006.01)
*H05K 5/03* (2006.01)

(52) U.S. Cl.
CPC .................................... *H05K 5/03* (2013.01)

(58) Field of Classification Search
CPC ........................... H05K 5/0017; H05K 5/0217
USPC ......................................... 361/807, 809, 810
See application file for complete search history.

(56) References Cited

U.S. PATENT DOCUMENTS

| 10,694,625 | B2 | 6/2020 | Park et al. |
| 11,823,595 | B2 | 11/2023 | Wang |
| 2015/0043174 | A1* | 2/2015 | Han ................... G02F 1/13452 428/156 |
| 2016/0357052 | A1* | 12/2016 | Kim ...................... H10K 59/87 |

(Continued)

FOREIGN PATENT DOCUMENTS

| CN | 110518039 A | 11/2019 |
| CN | 110752232 A | 2/2020 |

(Continued)

*Primary Examiner* — Hung S. Bui
(74) *Attorney, Agent, or Firm* — Slater Matsil, LLP

(57) ABSTRACT

Provided are a support plate, a display screen, and an electronic device. The support plate includes a first board and a second board. The first board and the second board are arranged back to back, and the first board is configured to be attached to a display panel. The support plate includes a bending area, and the support plate is configured to bend in the bending area along a preset axial line L. First strip-shaped slots are formed on the first board, and second strip-shaped slots distributed in an array at intervals along the axial line L are formed on the second board. The first strip-shaped slots are continuously provided along the axial line L and extend through the first board to form a unified edge structure.

20 Claims, 7 Drawing Sheets

(56) References Cited

U.S. PATENT DOCUMENTS

| | | |
|---|---|---|
| 2020/0319672 A1 | 10/2020 | Kim et al. |
| 2021/0141419 A1 | 5/2021 | Wang et al. |
| 2021/0165454 A1* | 6/2021 | Dong .................... G06F 1/1652 |
| 2021/0168929 A1* | 6/2021 | Wang ..................... H05K 1/028 |
| 2021/0192984 A1 | 6/2021 | Yoo et al. |
| 2022/0343809 A1 | 10/2022 | Chen et al. |
| 2023/0082293 A1 | 3/2023 | Lv et al. |
| 2023/0176621 A1 | 6/2023 | Zhou et al. |

FOREIGN PATENT DOCUMENTS

| | | | |
|---|---|---|---|
| CN | 110853520 A * | 2/2020 | ........... G06F 1/1652 |
| CN | 211455154 U | 9/2020 | |
| CN | 211481295 U | 9/2020 | |
| CN | 111862824 A | 10/2020 | |
| CN | 211928943 U | 11/2020 | |
| CN | 112164318 A | 1/2021 | |
| CN | 112991953 A | 6/2021 | |
| CN | 113112914 A | 7/2021 | |
| EP | 3477424 A1 | 5/2019 | |
| KR | 20190003257 A | 1/2019 | |
| KR | 20210087604 A | 7/2021 | |
| WO | 2020155736 A1 | 8/2020 | |

\* cited by examiner

Sectional view in direction A

Sectional view in direction B

Sectional view in direction C

SUPPORT PLATE, DISPLAY SCREEN, AND ELECTRONIC DEVICE

CROSS REFERENCE TO RELATED APPLICATIONS

This application is a national stage of International Application No. PCT/CN2022/092311 filed on May 11, 2022, which claims priority to Chinese Patent Application No. 202110846487.5 filed on Jul. 26, 2021. The disclosures of both of the aforementioned application are hereby incorporated by reference in their entireties.

TECHNICAL FIELD

This application relates to the technical field of display screens, and in particular, to a support plate, a display screen, and an electronic device.

BACKGROUND

In recent years, with the continuous development of display screen technologies of electronic devices, especially the emergence of a flexible display enables more product forms to be developed for electronic devices. A foldable screen device is a currently emerging product form. A display screen of the foldable screen device may include a three-layer stacked structure, and the three-layer stacked structure includes a support plate, a display panel, and a cover plate in sequence from bottom to top. The support plate may include at least one bending area, and the display screen is configured to realize bending and folding in the bending area.

At present, technicians groove the bending area of the support plate based on specific patterns to provide more deformation space for the support plate, so as to reduce the internal stress generated during bending of the support plate and improve bending performance of the bending area. However, a hollowed-out structure destroys the structural continuity and integrity of the support plate, which leads to a non-uniform stress distribution at different positions during bending of the support plate. Such a non-uniform stress distribution may cause the display screen to generate an attachment trace (also referred to as a mark) on an attachment surface between the support plate and the display panel. The mark results in a visual effect resembling cracks on the display screen, which affects display performance of the display screen.

SUMMARY

Embodiments of this application provide a support plate, a display screen, and an electronic device, which can solve the problem of a mark of a foldable display screen, avoid a visual effect resembling cracks on the display screen and improve display performance of the display screen.

According to a first aspect, an embodiment of this application provides a support plate. The support plate includes a first board and a second board. The first board and the second board are arranged back to back, and the first board is configured to be attached to a display panel. The support plate includes a bending area, and the support plate is configured to bend in the bending area along a preset axial line L. The bending area is provided with a hollowed-out structure, the hollowed-out structure includes a plurality of through grooves, and the plurality of through grooves are distributed in an array in a direction perpendicular to the axial line L. Each of the through grooves includes one first strip-shaped slot and N second strip-shaped slots, and N is a positive integer greater than 1. The first strip-shaped slot and each of the second strip-shaped slots are both formed in parallel with the axial line L. The first strip-shaped slot is formed on the first board and extends toward the second board by a specific depth, and the first strip-shaped slot is continuously provided along the axial line L and extends through the first board. The second strip-shaped slot is formed on the second board, extends toward the first board to a bottom of the first strip-shaped slot, and is in communication with the first strip-shaped slot. A length of the second strip-shaped slot is less than a width of the support plate along the axial line L, and N second strip-shaped slots are distributed in an array at intervals along the axial line L.

According to the support plate provided in this embodiment of this application, the first strip-shaped slot is formed on the first board where the support plate is attached to the display panel. The first strip-shaped slots are continuously provided along the axial line L and extend through the first board to form a unified edge structure. The edge structure provides a uniform stress distribution for the support plate during bending of the support plate, such that a mark is not generated on a display screen on an attachment surface between the support plate and the display panel due to a non-uniform stress distribution, thereby improving display performance of the display screen. In addition, the second strip-shaped slots distributed in an array at intervals along the axial line L provide a structural continuity for the support plate on the second board, thereby ensuring a structural strength of the support plate.

In an implementation, projections of center lines of the N second strip-shaped slots coincide with a projection of a center line of the first strip-shaped slot in a thickness direction of the support plate, thereby improving continuity of the through groove in a depth direction thereof.

In an implementation, a depth of each of the second strip-shaped slot is greater than a depth of the first strip-shaped slot. In this way, the continuous structure between two adjacent second strip-shaped slots along the axial line L direction can have a larger thickness, which is beneficial to improve the structural strength of the support plate.

In an implementation, the first strip-shaped slot is a structure with a constant width. The structure with a constant width can improve uniformity of the edge structure, improve uniformity of a stress distribution during bending of the support plate, and avoid generating a mark on the display screen.

In an implementation, the second strip-shaped slot includes a first slot segment and second slot segments located on two ends of the first slot segment. A width of each of the second slot segments is greater than a width of the first slot segment, and two ends of the second strip-shaped slot are round-cornered structures. Since the width of the second slot segment is greater than the width of the first slot segment, a radius of the round-cornered structure is larger, which can reduce a stress concentration at an intersection of the two ends of the second strip-shaped slot and the first strip-shaped slot.

In an implementation, the width of the second slot segment is greater than the width of the first strip-shaped slot, and the width of the first slot segment is equal to the width of the first strip-shaped slot. In this way, the first strip-shaped slot and the first slot segment can form a through groove with a constant width as a whole, so that the structural integrity is better, uniformity of the stress distribution can be improved. The two ends of the second strip-shaped slot can form a round-cornered structure with a larger radius, which can reduce the stress concentration at the intersection of the two ends of the second strip-shaped slot and the first strip-shaped slot.

In an implementation, the through groove is filled with a flexible medium, the flexible medium forms a first filling plane in the first strip-shaped slot and forms a second filling plane in the second strip-shaped slot, the first filling plane and the first board are located in a same plane, and the second filling plane and the second board are located in a same plane. The flexible medium can improve the flatness of the support plate and also alleviate the mark.

In an implementation, the flexible medium is liquid silicone rubber.

In an implementation, a material of the support plate includes any one of: a TA4 titanium alloy, stainless steel and high-modulus polyvinyl alcohol PVA fiber.

According to a second aspect, an embodiment of this application provides a display screen. The display screen includes a cover plate, a display panel, and the support plate according to the first aspect of the embodiments of this application and the implementations of the first aspect. The display panel is attached to a first surface of the support plate through optically clear adhesive. The cover plate is attached to a side of the display panel facing away from the support plate through the optically clear adhesives.

According to a third aspect, an embodiment of this application provides an electronic device. The electronic device includes one or more display screens, where at least one of the display screens is the display screen according to the second aspect of the embodiments of this application.

DETAILED DESCRIPTION OF ILLUSTRATIVE EMBODIMENTS

In recent years, with the continuous development of display screen technologies of electronic devices, especially the emergence of a flexible display enables more product forms to be developed for electronic devices. A foldable screen device is a currently emerging product form.

Figures 1, 2:
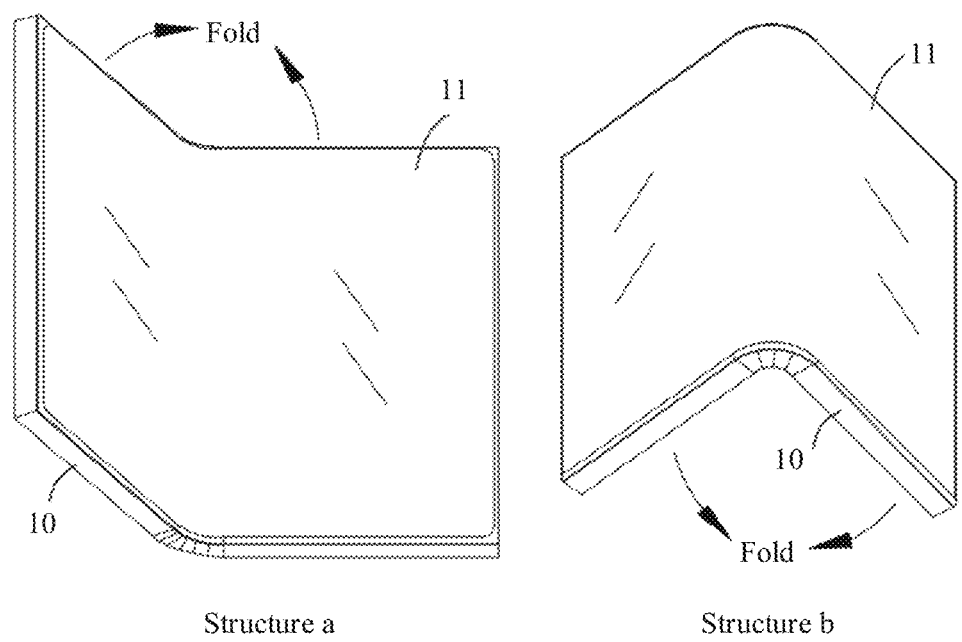
FIG. 1 is a schematic structural diagram of a foldable screen device according to an embodiment of this application.
FIG. 2 is a schematic structural diagram of a display screen of a foldable screen device according to an embodiment of this application.

At present, the foldable screen devices may be divided into inner foldable screen devices and outer foldable screen devices based on different folding directions of a display screen 11. FIG. 1 is a schematic structural diagram of a foldable screen device according to an embodiment of this application. A structure a in FIG. 1 is a schematic diagram of an inner foldable screen device, and a structure b in FIG. 1 is a schematic diagram of an outer foldable screen device. As shown in the structure a in FIG. 1, the inner foldable screen device means that a body 10 of the electronic device is foldable toward a side of the display screen 11, and the display screen 11 is hidden inside the body 10 of the electronic device after the body 10 of the electronic device is folded, thereby forming an effect that the display screen 11 is hidden in the folded state of the body 10 and presented in the unfolded state of the body 10. As shown in the structure b in FIG. 1, the outer foldable screen device means that the body 10 of the electronic device is foldable toward a back side of the body 10, and the display screen 11 surrounds outer sides of the body 10 of the electronic device after the body 10 of the electronic device is folded, so that the display screen 11 surrounds the body 10 in a folded state of the body 10 to form a surrounding screen, and an effect of a normal straight screen is presented when the body 10 is in the unfolded state.

It may be understood that the display screen of the foldable screen device needs to be bent frequently, and therefore compared with the electronic device in a conventional form, the display screen of the foldable screen device needs to be designed adaptively for usage scenarios where the display screen is frequently bent, so that the display screen can maintain a good supporting form in different opening and closing states of the body.

FIG. 2 is a schematic structural diagram of a display screen of a foldable screen device according to an embodiment of this application. As shown in FIG. 2, a display screen of the foldable screen device may include a three-layer stacked structure, and the three-layer stacked structure includes a support plate 21, a display panel 22 (panel), and a cover plate 23 (cover) in sequence from bottom to top. The support plate 21 is the lowest layer of the display screen, and is generally made of high-modulus plates, such as stainless steel, TA4 titanium alloy, and high-modulus polyvinyl alcohol fiber PVA, and may also be made of other specific materials with plasticity and rigidity. The support plate 21 is configured to support and maintain forms of the display screen in opening and closing states of a body. The display panel 22 is an intermediate layer of the display screen, and may be attached above the support plate 21 through an optically clear adhesive (optically clear adhesive, OCA). The display panel 22 may be a flexible organic light-emitting diode (organic Light-Emitting Diode, OLED) display panel 22 or another flexible (that is, bendable) display panel 22, such as a flexible Micro LED display panel 22 and a Mini LED display panel 22. This is not limited in this embodiment of this application. The cover plate 23 is the uppermost layer of the display screen, and may be attached to the top of the display panel 22 through the optically clear adhesive OCA. Generally, in a non-foldable screen electronic device, the cover plate 23 is made of glass, and in a foldable screen device, considering the bending performance, the cover plate 23 may be made of a transparent film material, such as transparent polyimide film CPI, or other materials, which is not limited in this embodiment of this application.

Figure 3:
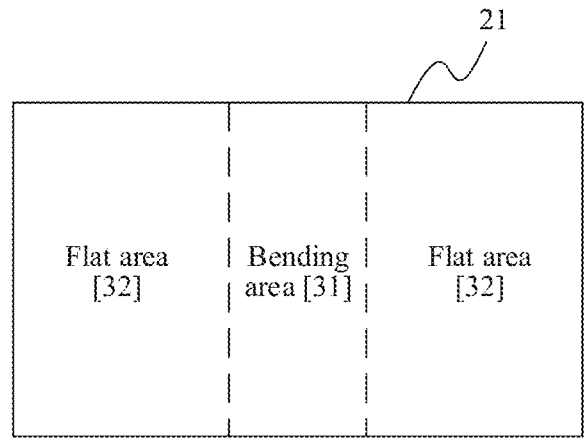
FIG. 3 is a schematic diagram of a support plate according to an embodiment of this application after being unfolded.

FIG. 3 is a schematic diagram of a support plate according to an embodiment of this application after being unfolded. As shown in FIG. 3, a support plate 21 may include at least one bending area 31, and an area outside the bending area 31 is a flat area 32. The bending area 31 is an area that bends when a body of a foldable screen device is folded, and the flat area 32 is an area that does not bend when the body of the foldable screen device is folded. Obviously, a number of bending areas 31 is determined by a number of times for which the body of the foldable screen device is folded. If the body of the foldable screen device is folded only once (that is, a single foldable screen device), the display screen may include one bending area 31, and if the body of the foldable screen device is folded twice (that is, a double foldable screen device), the display screen may include two bending areas 31. For example, the display screen shown in FIG. 3 includes a bending area 31 arranged up and down, and the flat area 32 is located on left and right sides of the bending area 31 and is used to realize left and right bending of the body of the foldable screen device. The number of bending areas 31 of the display screen is beyond the discussion scope of this embodiment of this application, and therefore the details are not described below again.

Figure 4:
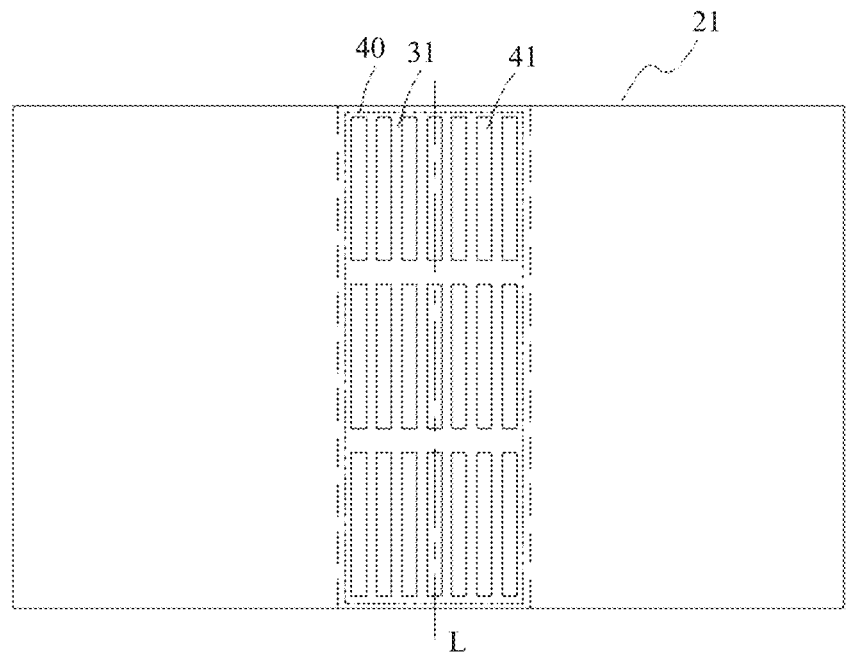
FIG. 4 is a schematic structural diagram of a support plate according to an embodiment of this application in a bending area.

FIG. 4 is a schematic structural diagram of a support plate according to an embodiment of this application in a bending area. As shown in FIG. 4, in order to improve the bending performance, the support plate 21 is slotted in the bending area 31 based on a specific design (also referred to as a pattern) to form a hollowed-out structure 40. The pattern is generally an array of strip-shaped slots 41 extending along an axial line L during bending of the support plate 21. The strip-shaped slots 41 are generally discontinuous in the axial line L to ensure a structural continuity of the support plate 21 in a direction perpendicular to the axial line L. However, during the bending of the display screen, structural changes formed at discontinuities of the strip-shaped slots 41 cause a non-uniform stress distribution for the support plate 21 at the discontinuities of the strip-shaped slots 41, resulting in a mark.

Figure 5:
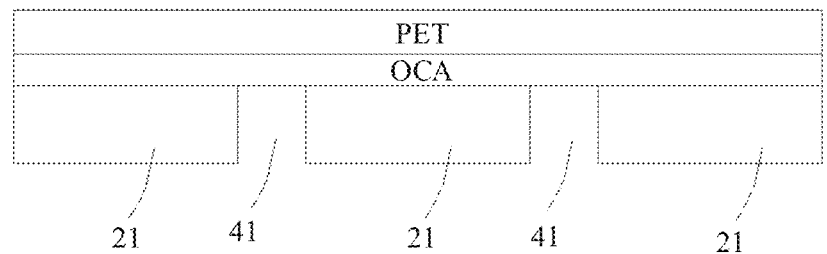
FIG. 5 is a schematic diagram of attachment between a display panel and a support plate according to an embodiment of this application.

FIG. 5 is a schematic diagram of attachment between a display panel and a support plate according to an embodiment of this application. Causes of generating the mark are described below in detail with reference to FIG. 5. As shown in FIG. 5, a side of the display panel facing the support plate 21 is generally provided with polyester film PET, and the support plate 21 and the polyester film PET are fitted together through an optically clear adhesive OCA. During the bending of the display screen, the optically clear adhesive OCA between the polyester film PET and the support plate 21 is dislocated due to bending, and overflow or contraction occurs in a hollowed-out area formed by the strip-shaped slots 41. Due to a non-uniform stress distribution of the support plate 214 at discontinuities of the strip-shaped slots 41, overflown or contracted optically clear adhesive cannot be restored to an initial state after the display screen is unfolded, resulting in formation of local alternating accumulation and final formation of a mark.

For the problems existing in the display screen of foldable screen device at present, an embodiment of this application provides a support plate.

Figure 6:
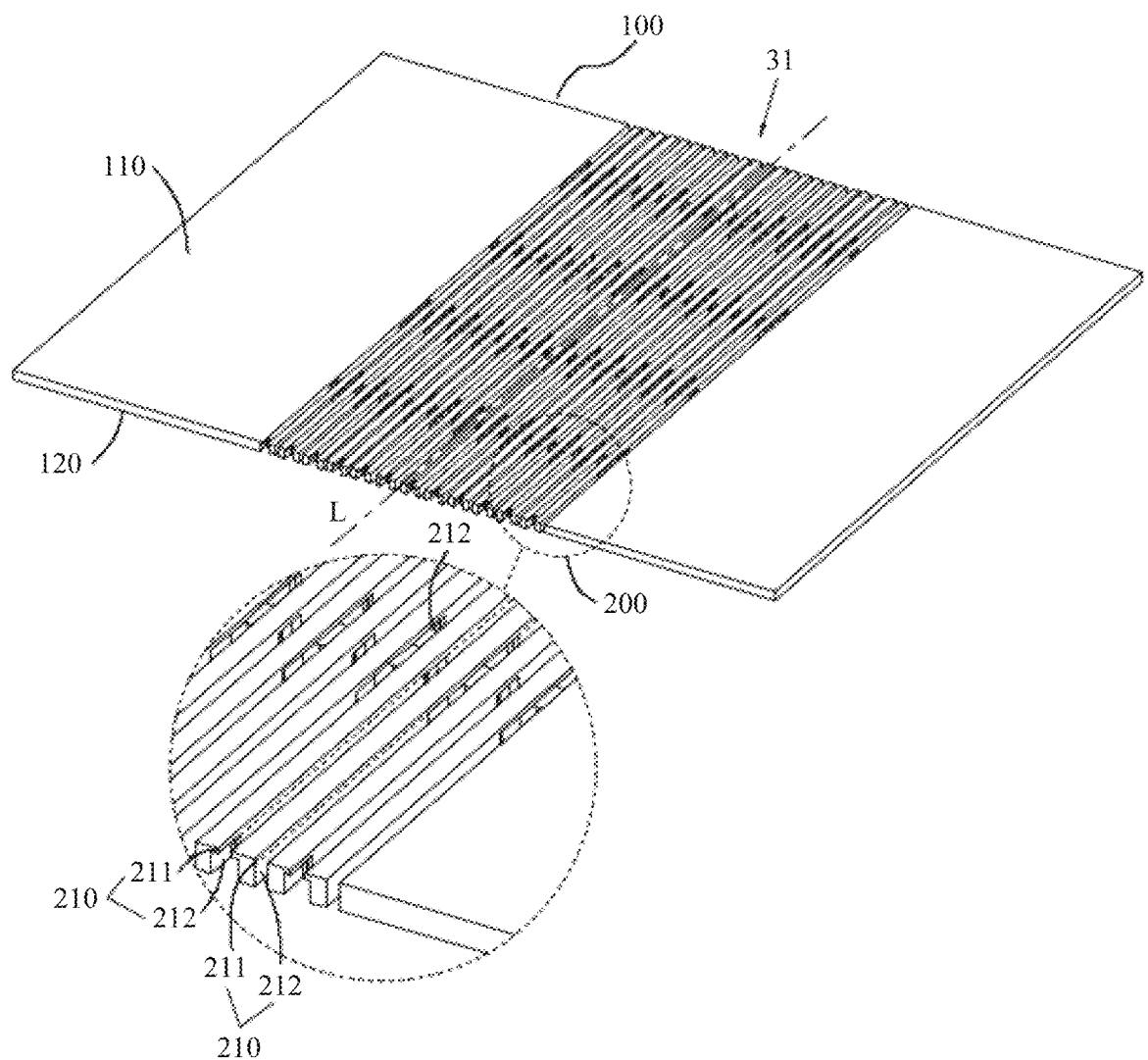
FIG. 6 is a schematic structural diagram of a support plate according to an embodiment of this application.

FIG. 6 is a schematic structural diagram of a support plate according to an embodiment of this application. As shown in FIG. 6, the support plate 100 includes two boards arranged back to back. For convenience of description, the two boards of the support plate 100 are referred to as a first board 110 and a second board 120 herein. The first board 110 is a board of the support plate 100 configured to be attached to the display panel, and the second board 120 is a board of the support plate 100 facing away from the display panel. The support plate 100 includes at least one bending area 31, and the support plate 100 may be bent along a preset axial line L in the bending area 31. In this way, after the support plate 100 provided in this embodiment of this application is combined with a display panel and a cover plate to form a display screen, the display screen may also be bent along the axial line L in the bending area 31. In this embodiment of this application, based on different bending directions of the support plate 100, the bending area may be divided into an inward bending area or an outward bending area. The inward bending area is an area of the support plate 100 that bends toward the display panel, and the outward bending area is an area of the support plate 100 that bends away from the display panel.

Further, as shown in FIG. 6, the bending area 31 of the support plate 100 is provided with a hollowed-out structure 200. The hollowed-out structure 200 may be composed of a plurality of through grooves 210 distributed in the bending area 31, and the plurality of through grooves 210 are distributed in an array at specific intervals in a direction perpendicular to the axial line L. The through grooves 210 extend through the first board 110 of the support plate 100 to the second board 120 of the support plate 100 as a whole, which reduces the stress generated when the support plate 100 is bent by removing materials, and facilitates improvement of bending performance of the support plate 100.

Further, as shown in FIG. 6, each of the through grooves 210 may be composed of one first strip-shaped slot 211 arranged on the first board 110 and N second strip-shaped slots 212 arranged on the second board 120, and the first strip-shaped slot 211 and the second strip-shaped slots 212 are all arranged in parallel with the axial line L, where N is a positive integer greater than 1. The structure of the through groove 210 is described in detail below with reference to more accompanying drawings.

Figure 7:
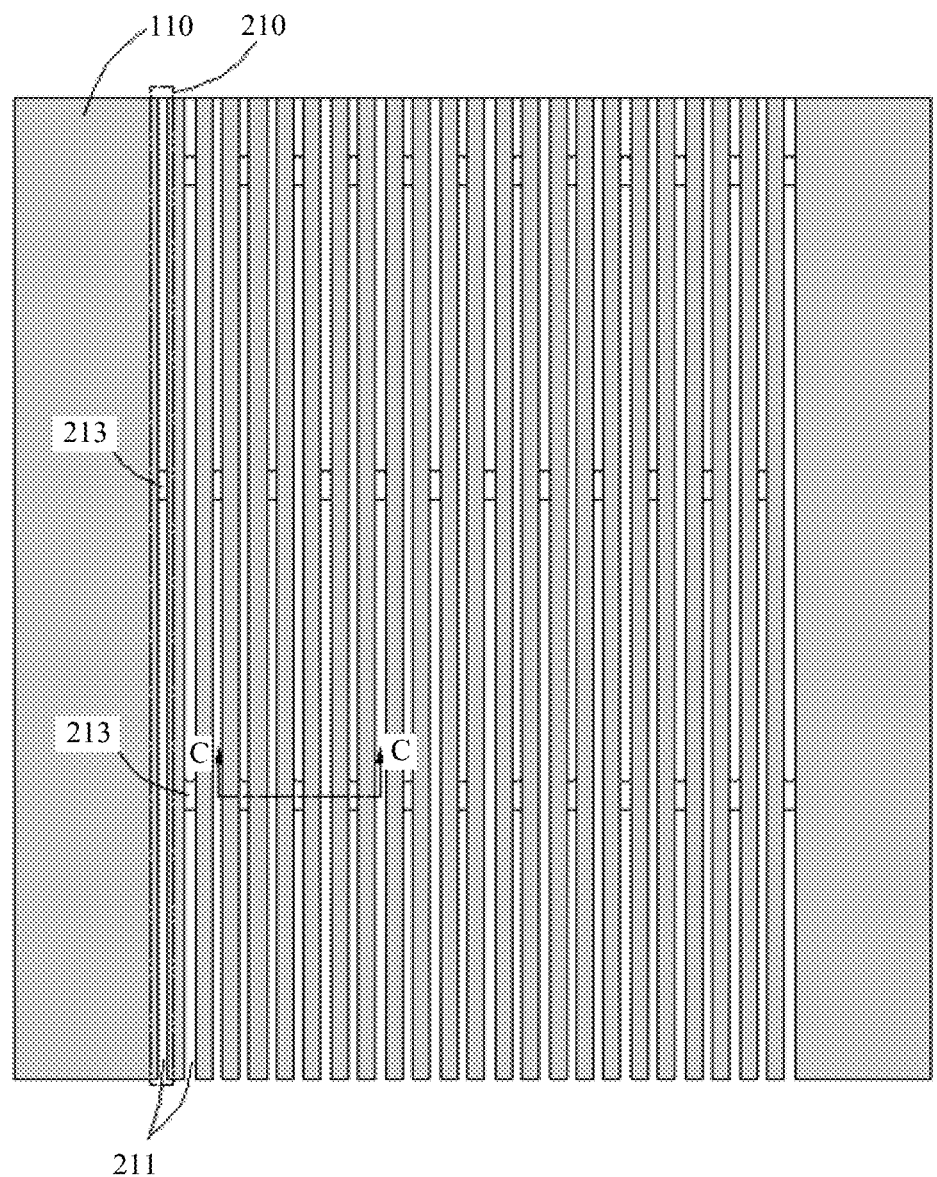
FIG. 7 is a schematic structural diagram of a first board according to an embodiment of this application.

FIG. 7 is a schematic structural diagram of a first board according to an embodiment of this application. As shown in FIG. 7, a first board 110 is provided with a plurality of first strip-shaped slots 211. The first strip-shaped slots 211 are preferably straight slots, and each of the first strip-shaped slots 211 belongs to a through groove 210. The first strip-shaped slots 211 may be obtained by etching the first board 110 to a specific depth. On the whole, the first strip-shaped slots 211 belonging to the through grooves 210 are distributed in an array at intervals in a direction perpendicular to an axial line L. The first strip-shaped slots 211 continuously extend from one side surface of the support plate to the other side surface along the axial line L, so that the first strip-shaped slots are continuously provided along the axial line L and extend through the first board 110. The first strip-shaped slot 211 is preferably a structure with a constant width, that is, widths of positions of the first strip-shaped slots 211 in a length direction thereof are the same. In this way, the positions of the first strip-shaped slots 211 in the length direction all have a uniform edge structure.

According to the support plate provided in this embodiment of this application, the first strip-shaped slot 211 is formed on the first board 110 where the support plate is attached to the display panel. The first strip-shaped slots 211 are continuously provided along the axial line L and extend through the first board 110 to form a unified edge structure on the first board 110. The edge structure provides a uniform stress distribution for the support plate during bending of the support plate. Therefore, if the support plate is used to make the display screen, an optically clear adhesive OCA between the support plate and the display panel does not accumulate locally after bending due to a non-uniform stress distribution, and therefore a mark is not generated, which improves display performance of the display screen.

In this embodiment of this application, a number of first strip-shaped slots 211 (that is, a number of through grooves 210) may be determined based on the width of the bending area in the direction perpendicular to the axial line L. A larger width of the bending area may lead to a larger number of first strip-shaped slots 211, and a smaller width of the bending area may lead to a smaller number of first strip-shaped slots 211.

Figure 8:
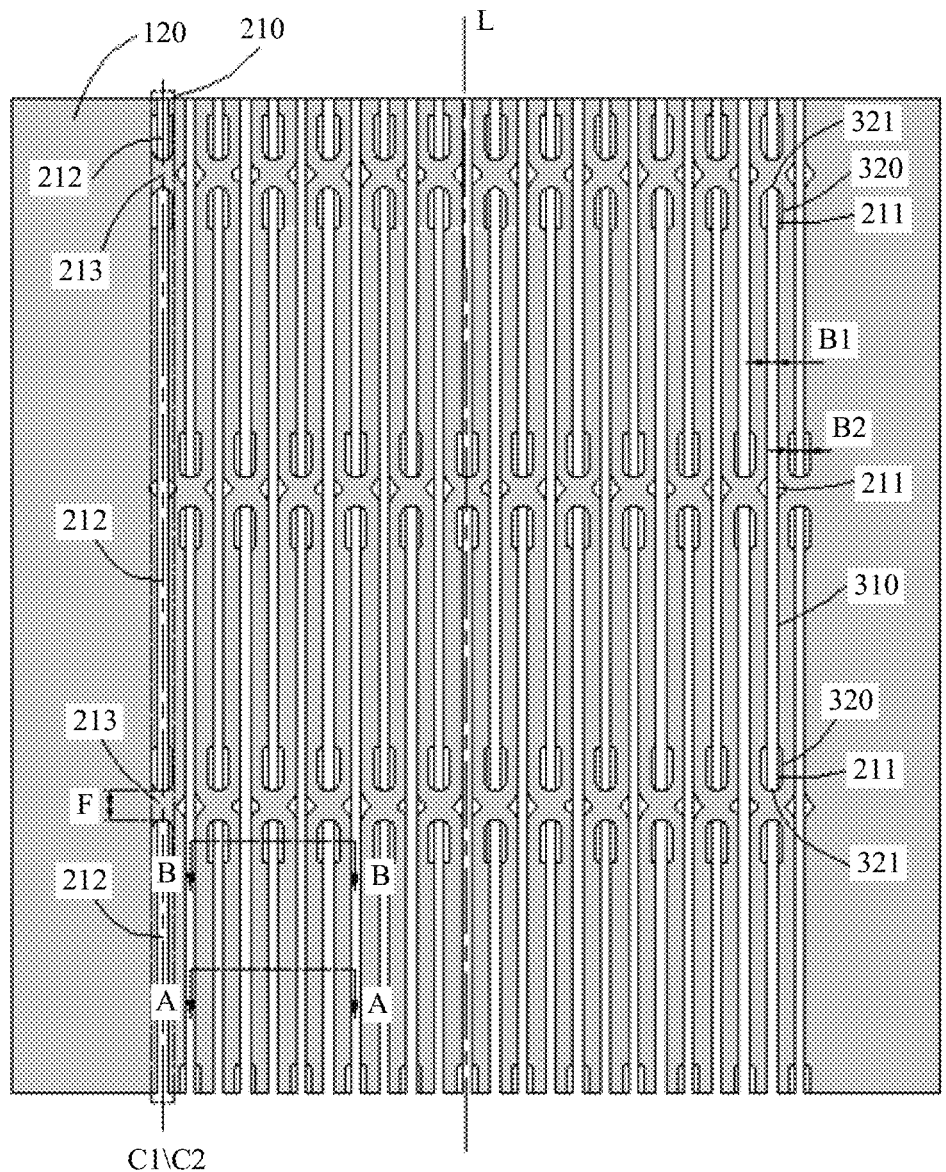
FIG. 8 is a schematic structural diagram of a second board according to an embodiment of this application.

FIG. 8 is a schematic structural diagram of a second board according to an embodiment of this application. As shown in FIG. 8, corresponding to a first strip-shaped slot 211, a second strip-shaped slot 212 is preferably a straight slot, which may be obtained by etching a second board 120 to a specific depth. A length of the second strip-shaped slot 212 is less than a width of the support plate in a direction of an axial line L. N second strip-shaped slots 212 belonging to the same through groove 210 are all located on projections of the first strip-shaped slots 210 corresponding to the second strip-shaped slots on the second board 120, and the N second strip-shaped slots 212 are distributed in an array along the axial line L. A specific interval F is defined between two adjacent second strip-shaped slots 212 along the axial line L, thereby forming a connecting structure 213 with a width of F.

Further, as shown in FIG. 8, the second strip-shaped slot 212 starts from the second board 120, extends to a bottom of the first strip-shaped slot 211 in the direction of the first board, and is communication with the first strip-shaped slot 211 corresponding to the second strip-shaped slot, thereby forming a through groove 210 structure. In order to improve continuity of the through groove 210 in a depth direction thereof, for the same through groove 210, projections of center lines C1 of the N second strip-shaped slots 212 coincide with a projection of a center line C2 of the first strip-shaped slot 211 in a thickness direction of the support plate.

It may be understood that since the second board 120 is not attached to the display panel, the mark does not need to be considered for the shape design of the second strip-shaped slot 212. Therefore, each of the second strip-shaped slots 212 may be a structure with a constant width or a structure with an inconstant width, that is, widths of positions of the second strip-shaped slots 212 in a length direction thereof may be equal or not equal. For example, when the second strip-shaped slot 212 is a structure with a constant width, the width of the second strip-shaped slot may be equal or not equal to the width of the first strip-shaped slot 211. When the second strip-shaped slot 212 is a structure with an inconstant width, the width of the second strip-shaped slot may be equal to the width of the first strip-shaped slot 211 at some positions, may be greater than the width of the first strip-shaped slot 211 at some positions, or may further be less than the width of the first strip-shaped slot 211 at some positions, which is not limited in this embodiment of this application.

In an implementation, as shown in FIG. 8, the second strip-shaped slot 212 may specifically include a first slot segment 310 and second slot segments 320 located on two ends of the first slot segment 310 in the length direction of the second strip-shaped slot. The first slot segment 310 and the second slot segment 3203 have different widths as a whole. For example, an overall width of the first slot segment 310 is B1, and an overall width of the second slot segment 320 is B2. The width B2 of the second slot segment 320 is preferably greater than the width B1 of the first slot segment 310, so that the second strip-shaped slot 212 forms a dumbbell-shaped structure with two wide ends and a thin middle as a whole. In this way, the second slot segment 320 with a larger width can form a round-cornered structure 321 with a larger radius on two ends of the second strip-shaped slot 212, which is beneficial to reducing a stress concentration during bending of the support plate.

Figure 9:
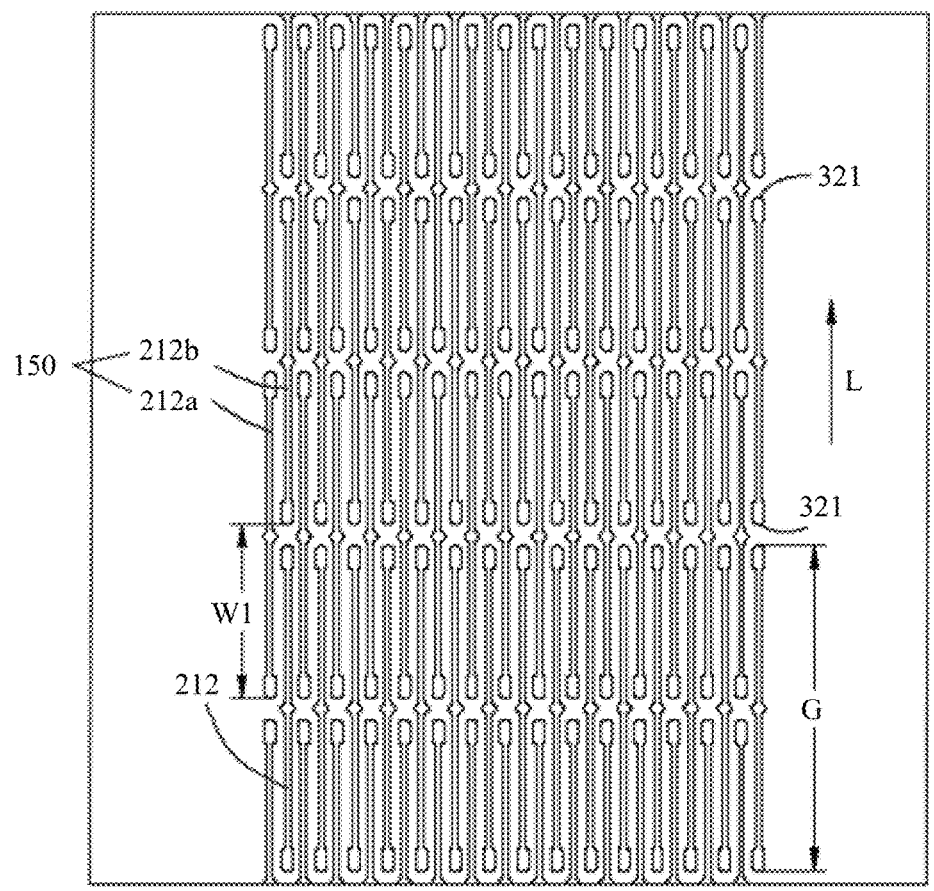
FIG. 9 is a schematic diagram of a distribution mode of second strip-shaped slots according to an embodiment of this application.

FIG. 9 is a schematic diagram of a distribution mode of second strip-shaped slots according to an embodiment of this application. As shown in FIG. 9, in an implementation, a second strip-shaped slot 212 has a specific length G along an axial line L during bending of a support plate. Two ends of the second strip-shaped slot 212 in a length direction thereof are round-cornered corners 321, so that a side surface of the second strip-shaped slot 212 is smooth as a whole, and no large stress concentration is generated when bending occurs. Through the distribution mode of a plurality of second strip-shaped slots 212, a second strip-shaped slot 212a and a second strip-shaped slot 212b adjacent in a width direction may be used as basic array units 150, and the basic array unit 150 is obtained in a rectangular array in the length direction and the width direction of the second strip-shaped slots 212. The second strip-shaped slot 212a and the second strip-shaped slot 212b are located on projections of two adjacent first strip-shaped slots. For convenience of description, the two second strip-shaped slots 212 in the basic array unit 150 are referred to as the second strip-shaped slot 212a and the second strip-shaped slot 212b, and sizes of the second strip-shaped slot 212a and the second strip-shaped slot 212b may be the same or different. The second strip-shaped slot 212b is located on a side of the second strip-shaped slot 212a in the width direction of the second strip-shaped slot 212a, and is offset from the second strip-shaped slot 212a by a first distance W1 in the length direction, so that a center of the second strip-shaped slot 212a is located at the center of two adjacent second strip-shaped slots 212b. In this way, after the basic array unit 150 is arranged in a rectangular array, any two second strip-shaped slots 212 adjacent in the width direction are staggered from each other in the length direction.

Figure 10A:
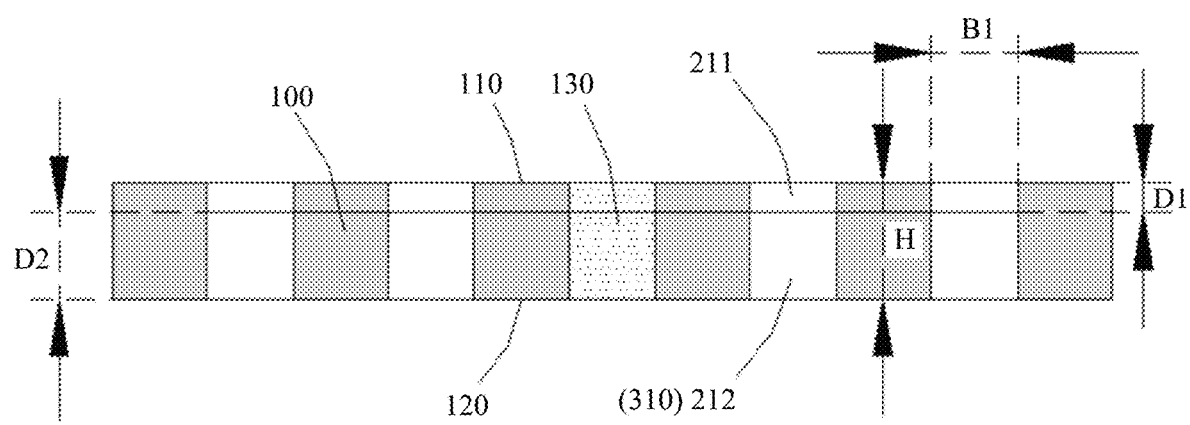
FIG. 10A is a cross-sectional view of a first strip-shaped slot and a first slot segment of a second strip-shaped slot according to an embodiment of this application.
Figure 10B:
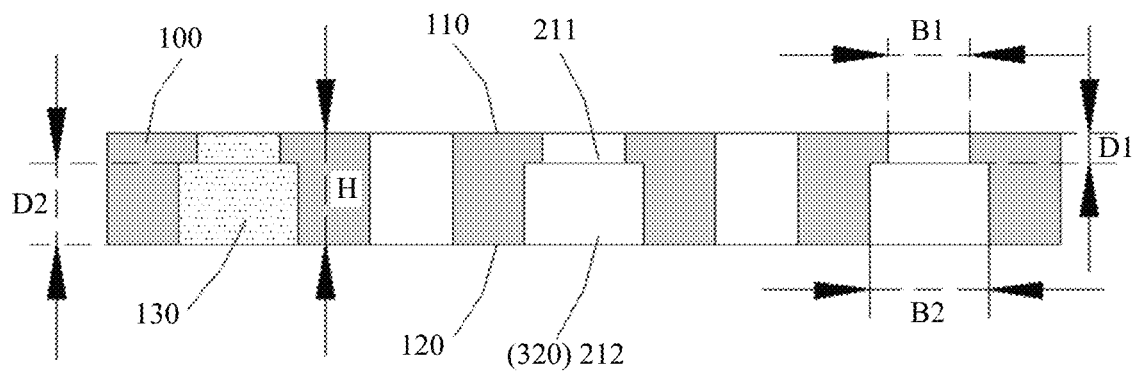
FIG. 10B is a cross-sectional view of a first strip-shaped slot and a second slot segment of a second strip-shaped slot according to an embodiment of this application.

FIG. 10A and FIG. 10B are cross-sectional views of a first strip-shaped slot and a second strip-shaped slot according to an embodiment of this application. FIG. 10A may be, for example, a cross-sectional view of the first strip-shaped slot and a first slot segment of the second strip-shaped slot, and FIG. 10B may be, for example, a cross-sectional view of the first strip-shaped slot and a second slot segment of the second strip-shaped slot. As shown in FIG. 10A and FIG. 10B, in an area of a support plate where the first strip-shaped slot 211 and the second strip-shaped slot 212 are formed, the first strip-shaped slot 211 has a specific depth D1 in a thickness direction of the support plate 100, and the second strip-shaped slot 212 has a specific depth D2 in the thickness direction of the support plate loft A sum of the depth D1 of the first strip-shaped slot 211 and the depth D2 of the second strip-shaped slot 212 is equal to a thickness H of the support plate boo. In this way, in the area where the first strip-shaped slot 211 and the second strip-shaped slot 212 are simultaneously arranged, the first strip-shaped slot 211 and the second strip-shaped slot 212 located on the projection of the first strip-shaped slot extend through the support plate 100 to form a through groove.

Further, as shown in FIG. 10B, in an implementation, a width B2 of the second slot segment 320 of the second strip-shaped slot 212 is preferably greater than a width B1 of the first strip-shaped slot 211. In this way, two ends of the second strip-shaped slot 212 can form a round-cornered structure with a larger radius, which can reduce a stress concentration at an intersection of the two ends of the second strip-shaped slot 212 and the first strip-shaped slot 211.

Further, as shown in FIG. 10A, in an implementation, considering that the second strip-shaped slot 212 does not involve stress concentration in the first slot segment 310, the width B1 of the first slot segment 310 of the second strip-shaped slot 212 is preferably equal to the width B1 of the first strip-shaped slot 211. In this way, the first strip-shaped slot 211 and the first slot segment 310 of the second strip-shaped slot 212 can form a through groove with a constant width as a whole, so that the structural integrity is better, and uniformity of the stress distribution can be improved.

Figure 11:
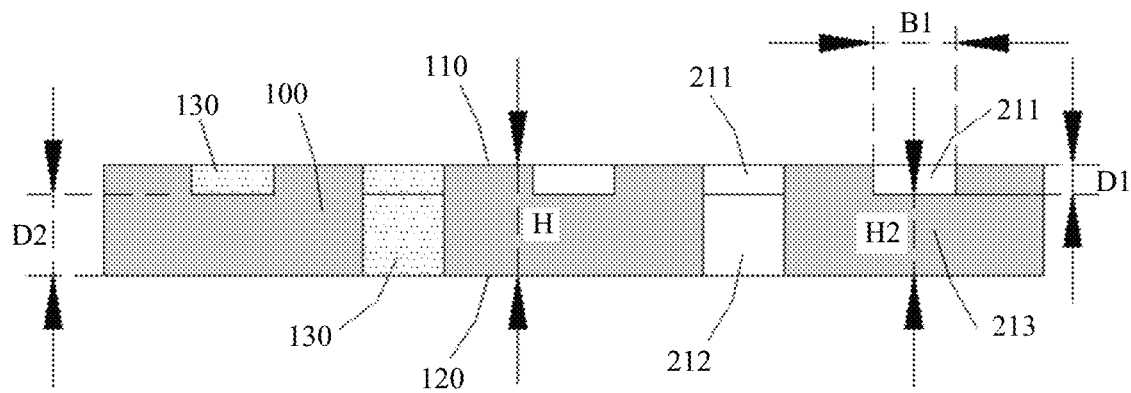
FIG. 11 is a cross-sectional view of a first strip-shaped slot and a connecting structure according to an embodiment of this application.

FIG. 11 is a cross-sectional view of a first strip-shaped slot and a connecting structure according to an embodiment of this application. As shown in FIG. 11, in an area where a connecting structure 213 is arranged (that is, an area between two adjacent second strip-shaped slots 212 along an axial line L), the first strip-shaped slot 211 has a specific depth D1 in a thickness direction of the support plate 100, and the rest of the support plate 100 except the first strip-shaped slot 211 is the connecting structure 213. Therefore, a thickness H2 of the connecting structure 213 is equal to a depth D2 of the second strip-shaped slot. When first strip-shaped slot 211 and the second strip-shaped slot 212 extend through the support plate 100 to form a through groove, the connecting structure 213 maintains a structural continuity of the support plate 100 and improves a structural strength of the support plate boo.

In an implementation, a thickness H2 of the connecting structure 213 (that is, the depth D2 of the second strip-shaped slot 212) is preferably greater than the depth D1 of the first strip-shaped slot 211, so that the connecting structure 213 can achieve a relatively large thickness to improve the overall strength of the support plate 100.

For example, the thickness H2 of the connecting structure 213 may be preferably greater than four fifths of the thickness H of the support plate 100, and the depth D1 of the first strip-shaped slot 211 is correspondingly less than one fifth of the thickness H of the support plate 100. In this way, in the bending area, the support plate 100 realizes the uniform stress distribution during bending of the support plate through the first strip-shaped slot 211 with a small depth, and the structural continuity of the support plate 100 is ensured through the connecting structure 213 with a large thickness, which not only realizes the effect of eliminating a mark on the display screen, but also improves the structural strength of the support plate 100 as much as possible.

Further, as shown in FIG. 10A, FIG. 10B, and FIG. 11, in an implementation, the first strip-shaped slot 211 and the second strip-shaped slot 212 are also filled with a flexible medium 130 (FIG. 10A, FIG. 10B, and FIG. 11 only show the flexible medium 130 in part of the first strip-shaped slot 211 and the second strip-shaped slot 212, and the rest of the first strip-shaped slot 211 and the second strip-shaped slot 212 in which the flexible medium 130 is not shown are also filled with the flexible medium 130). The filled flexible medium 130 is located in a same plane as a non-slotted area of the support plate 100, which improves flatness of the support plate 100 and also has the effect of alleviating the mark.

In an implementation, the flexible medium 130 may be, for example, liquid silicone rubber (LSR). The liquid silicone rubber may be injected into the first strip-shaped slot 211 and the second strip-shaped slot 212 through a liquid silicone injection molding process (liquid injection molding system, LIMS), so that the liquid silicone rubber and the main body of the support plate 100 are integrally formed.

Next, the injection molding process of the liquid silicone rubber involved in this embodiment of this application is described by using examples. Generally, liquid silicone rubber is a two-component glue, including glue A and glue B. Glue A and glue B are liquids at room temperatures, and can be cured quickly after being mixed and heated to a specific temperature. Before injection molding, a mixing process is performed first, that is, glue A and glue B are mixed. Then, the mixed liquid silicone rubber is injected into the first strip-shaped slot 211 and the second strip-shaped slot 212, thereby filling the whole through groove. Finally, the injected liquid silicone rubber is heated and pressurized to be solidified, and the solidified liquid silicone rubber is to be integrated with the main structure of the support plate 100, so that the liquid silicone rubber and the board of the support plate 100 are located in the same plane.

An embodiment of this application further provides a display screen. The display screen includes a support plate, a display panel and a cover plate provided in implementations of the embodiments of this application, so that a mark and cracks are not generated on the display screen, and the display screen has good display performance.

An embodiment of this application further provides an electronic device, the electronic device may be, for example, a foldable screen device, a rollable device, or any one electronic device with a bendable display screen. The electronic device may include one display screen. At least one display screen is the display screen provided in an embodiment of this application, or at least one display screen includes a support plate provided in the embodiment of the application. For example, the electronic device may be an internal foldable screen device. The internal foldable screen device may include an internal screen and an external screen. The internal screen is a display screen hidden in a folded state of a fuselage, and the external screen is a display screen exposed in any state of the fuselage. The internal screen is the display screen provided in this embodiment of this application.

It is easy to understand that a person skilled in the art may combine, split, recombine the embodiments of this application on the basis of several embodiments provided in this application to obtain other embodiments, and all of the embodiments fall within the protection scope of this application.

The objectives, technical solutions, and benefits of this application are further described in detail in the foregoing specific implementations. It should be understood that the foregoing descriptions are merely specific implementations of this application, and are not intended to limit the protection scope of this application. Any modification, equivalent replacement, or improvement made based on the technical solutions in this application shall fall within the protection scope of this application.

What is claimed is:
1. A support plate, comprising:
a first board and a second board, wherein:

the first board and the second board are arranged back to back, and the first board is configured to be attached to a display panel;

the support plate comprises a bending area, and the support plate is configured to bend in the bending area along a preset axial line L;

the bending area is provided with a hollowed-out structure, the hollowed-out structure comprises a plurality of through grooves, and the plurality of through grooves are distributed in an array in a direction perpendicular to the axial line L; and each through groove of the plurality of through grooves comprises one first strip-shaped slot and N second strip-shaped slots, and N is a positive integer greater than 1, wherein for each through groove:

the first strip-shaped slot and each of the second strip-shaped slots are all formed in parallel with the axial line L, and projections of center lines of the N second strip-shaped slots coincide with a projection of a center line of the first strip-shaped slot along a line that is parallel to the axial line L;

the first strip-shaped slot is formed on the first board and extends toward the second board by a depth, and the first strip-shaped slot is continuously provided along the axial line L and extends through the first board;

the N second strip-shaped slots are formed on the second board, extend toward the first board to a bottom of the first strip-shaped slot, and are in communication with the first strip-shaped slot; and a length of the N second strip-shaped slots is less than a width of the support plate along the axial line L, and the N second strip-shaped slots are distributed in an array at intervals along the axial line L.

2. The support plate according to claim 1, wherein for each through groove: a depth of the N second strip-shaped slots is greater than a depth of the first strip-shaped slot.

3. The support plate according to claim 1, wherein for each through groove: the first strip-shaped slot is a structure with a constant width.

4. The support plate according to claim 1, wherein for each through groove: each second strip-shaped slot comprises a first slot segment and second slot segments located on two ends of the first slot segment, and a width of each of the second slot segments is greater than a width of the first slot segment.

5. The support plate according to claim 4, wherein the width of each second slot segment is greater than the width of the corresponding first strip-shaped slot, and the width of each first slot segment is equal to the width of the corresponding first strip-shaped slot.

6. The support plate according to claim 1, wherein two ends of each second strip-shaped slot are round-cornered structures.

7. The support plate according to claim 1, wherein each through groove is filled with a flexible medium, the flexible medium forms a first filling plane in the first strip-shaped slot and a second filling plane in the N second strip-shaped slots, the first filling plane and the first board are located in a same plane, and the second filling plane and the second board are located in a same plane.

8. The support plate according to claim 7, wherein the flexible medium is liquid silicone rubber.

9. The support plate according to claim 1, wherein a material of the support plate comprises any one of a TA4 titanium alloy, stainless steel or high-modulus polyvinyl alcohol PVA fiber.

10. A display screen, comprising:

a cover plate, a display panel, and a support plate;

wherein the display panel is attached to a first board of the support plate through an optically clear adhesive; and wherein the cover plate is attached to a side of the display panel facing away from the support plate through the optically clear adhesive; and wherein the support plate comprises the first board and a second board, the first board and the second board are arranged back to back, and the first board is configured to be attached to the display panel;

wherein the support plate comprises a bending area, and the support plate is configured to bend in the bending area along a preset axial line L;

wherein the bending area is provided with a hollowed-out structure, the hollowed-out structure comprises a plurality of through grooves, and the plurality of through grooves are distributed in an array in a direction perpendicular to the axial line L; and wherein each through groove of the plurality of through grooves comprises one first strip-shaped slot and N second strip-shaped slots, and N is a positive integer greater than 1, wherein for each through groove:

the first strip-shaped slot and each of the second strip-shaped slots are all formed in parallel with the axial line L, and projections of center lines of the N second strip-shaped slots coincide with a projection of a center line of the first strip-shaped slot along a line that is parallel to the axial line L;

the first strip-shaped slot is formed on the first board and extends toward the second board by a depth, and the first strip-shaped slot is continuously provided along the axial line L and extends through the first board;

the N second strip-shaped slots are formed on the second board, extend toward the first board to a bottom of the first strip-shaped slot, and are in communication with the first strip-shaped slot; and a length of the N second strip-shaped slots is less than a width of the support plate along the axial line L, and the N second strip-shaped slots are distributed in an array at intervals along the axial line L.

11. The display screen according to claim 10, wherein for each through groove: a depth of the N second strip-shaped slots is greater than a depth of the first strip-shaped slot.

12. The display screen according to claim 10, wherein for each through groove: the first strip-shaped slot is a structure with a constant width.

13. The display screen according to claim 10, wherein for each through groove: each second strip-shaped slot comprises a first slot segment and second slot segments located on two ends of the first slot segment, and a width of each of the second slot segments is greater than a width of the first slot segment.

14. The display screen according to claim 13, wherein the width of each second slot segment is greater than the width of the corresponding first strip-shaped slot, and the width of each first slot segment is equal to the width of the corresponding first strip-shaped slot.

15. The display screen according to claim 10, wherein for each through groove: each second strip-shaped slot comprises a first slot segment and second slot segments located on two ends of the first slot segment, and a width of each of the second slot segments is greater than a width of the first slot segment.

16. The display screen according to claim 10, wherein two ends of at least one second strip-shaped slot are round-cornered structures.

17. An electronic device, comprising one or more display screens, wherein a first display screen of the one or more display screens comprises a cover plate, a display panel, and a support plate;
wherein the display panel is attached to a first board of the support plate through an optically clear adhesive; and
wherein the cover plate is attached to a side of the display panel facing away from the support plate through the optically clear adhesive;
wherein the support plate comprises the first board and a second board, the first board and the second board are arranged back to back, and the first board is configured to be attached to a display panel;
wherein the support plate comprises a bending area, and the support plate is configured to bend in the bending area along a preset axial line L;
wherein the bending area is provided with a hollowed-out structure, the hollowed-out structure comprises a plurality of through grooves, and the plurality of through grooves are distributed in an array in a direction perpendicular to the axial line L; and
wherein each through groove of the plurality of through grooves comprises one first strip-shaped slot and N second strip-shaped slots, and N is a positive integer greater than 1, wherein for each through groove:
the first strip-shaped slot and each of the second strip-shaped slots are all formed in parallel with the axial line L, and projections of center lines of the N second strip-shaped slots coincide with a projection of a center line of the first strip-shaped slot along a line that is parallel to the axial line L;
the first strip-shaped slot is formed on the first board and extends toward the second board by a depth, and the first strip-shaped slot is continuously provided along the axial line L and extends through the first board;
the N second strip-shaped slots are formed on the second board, extend toward the first board to a bottom of the first strip-shaped slot, and are in communication with the first strip-shaped slot; and
a length of the N second strip-shaped slots is less than a width of the support plate along the axial line L, and the N second strip-shaped slots are distributed in an array at intervals along the axial line L.

18. The electronic device according to claim 17, wherein for each through groove: a depth of the N second strip-shaped slots is greater than a depth of the first strip-shaped slot.

19. The electronic device according to claim 17, wherein for each through groove: the first strip-shaped slot is a structure with a constant width.

20. The electronic device according to claim 17, wherein for each through groove: a depth of the N second strip-shaped slots is greater than a depth of the first strip-shaped slot.

* * * * *